United States Patent
Berenbaum et al.

[11] Patent Number: 6,066,366
[45] Date of Patent: May 23, 2000

[54] METHOD FOR DEPOSITING UNIFORM TUNGSTEN LAYERS BY CVD

[75] Inventors: Daniel Berenbaum, San Francisco; David A. Duke, Sunnyvale, both of Calif.; Herald Hauf, Trets, France; Richard Petri, Rousset Cedex, France; Jean-Christopher Favreau, Baume, France

[73] Assignee: Applied Materials, Inc., Santa Clara, Calif.

[21] Appl. No.: 09/121,199

[22] Filed: Jul. 22, 1998

[51] Int. Cl.[7] ............................ C23C 16/08; H01L 21/285
[52] U.S. Cl. .................. 427/250; 427/253; 427/255.392; 427/255.394; 427/99; 427/124; 427/126.1; 438/648; 438/656; 438/685
[58] Field of Search ................................ 427/250, 99, 124, 427/126.1, 253, 255.392, 255.394; 438/648, 656, 685, 680

[56] References Cited

U.S. PATENT DOCUMENTS

| | | |
|---|---|---|
| 5,028,565 | 7/1991 | Chang et al. . |
| 5,332,691 | 7/1994 | Kinoshita et al. ...................... 437/192 |
| 5,407,698 | 4/1995 | Emesh ...................................... 427/99 |

*Primary Examiner*—Roy V. King
*Attorney, Agent, or Firm*—McDermott Will & Emery

[57] ABSTRACT

Within wafer and wafer-to-wafer uniformity of W layers deposited by CVD, employing $N_2$ for increased reflectivity, is significantly improved by omitting $N_2$ during at least a portion of deposition. Embodiments include depositing a W nucleation layer on a TiN layer employing gaseous $WF_6$ during a nucleation phase, omitting $WF_6$ during an interposition phase during which substantially no W deposition occurs, depositing a W layer employing gaseous $WF_6$ during a main deposition phase, flowing $N_2$ gas at least during the terminal portion of the main deposition phase and omitting $N_2$ gas during at least a portion of the nucleation phase and/or interposition phase, e.g., omitting $N_2$ gas during the entire interdeposition phase.

18 Claims, 3 Drawing Sheets

---

I. NUCLEATION PHASE:

LOW PRESSURE DEPOSITION OF W NUCLEATION LAYER BY GAS PHASE REDUCTION OF $WF_6$ WITH $SiH_4$ AND $H_2$;
WITH OR WITHOUT $N_2$ FLOW

II. INTERDEPOSITION PHASE:

DISCONTINUE FLOW OF $WF_6$ AND $SiH_4$;
ELEVATE PRESSURE;
NO W DEPOSITION;
NO NITROGEN FLOW

III. MAIN DEPOSITION PHASE:

HIGH PRESSURE DEPOSITION OF W LAYER BY GAS PHASE REDUCTION OF $WF_6$ WITH $H_2$;
FLOWING $N_2$ FOR IMPROVED REFLECTIVITY

| # | NUCLEATION PHASE | INTERDEPOSITION PHASE | MAIN DEPOSITION PHASE | RESULTS |
|---|---|---|---|---|
| 1 | ▨▨▨ | ▨▨▨ | ▨▨▨ | INSTABILITY |
| 2 |  | ▨▨▨ | ▨▨▨ | STABLE GROWTH |
| 3 | ▨ | ▨▨▨ | ▨▨▨ | STABLE GROWTH |
| 4 |  | ▨▨ | ▨▨▨ | INSTABILITY |
| 5 |  |  |  | STABLE GROWTH THICK |
| 6 | NO NUCLEATION |  | ▨▨▨ | STABLE GROWTH THICK |
| 7 |  |  | ▨▨▨ | STABLE GROWTH THICK |
| 8 | ▨▨ |  | ▨▨▨ | STABLE GROWTH THICK |
| 9 | ▨▨ |  | ▨ | STABLE GROWTH THICK |
| 10 | ▨▨ | ▨▨ |  ▨ | INSTABILITY |

N₂   NO N₂

Film thickness versus deposition time a) ◆ $N_2$ only during main deposition phase
b) ■ $N_2$ present during interdeposition and main deposition phases

METHOD FOR DEPOSITING UNIFORM TUNGSTEN LAYERS BY CVD

TECHNICAL FIELD

The present invention relates to a method of depositing tungsten by chemical vapor deposition. The present invention is particularly applicable to depositing a tungsten layer on a substrate of a semiconductor wafer.

BACKGROUND ART

The deposition of tungsten (W) by chemical vapor deposition (CVD) enjoys wide application through various industries, particularly in manufacturing semiconductor devices. The escalating requirements for high device density and performance wiring require responsive changes, which is considered one of the most demanding aspects of ultra large scale integration (ULSI) technology. Such escalating requirements have been difficult to satisfy in terms of providing low resistance capacitance (RC) interconnect patterns, particularly wherein sub-micron vias, contacts and trenches have high aspect ratios due to miniaturization, e.g., greater than 3.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, conductive patterns in different layers, i.e., upper and lower layers, are electrically connected by a conductive plug filling a via hole, while a conductive plug filling a contact hole establishes electrical contact with an active region on a semiconductor substrate, such as a source/drain region. Conductive lines formed in trench openings typically extend substantially horizontal with respect to the semiconductor substrate. Semiconductor "chips" comprising 5 or more levels of metallization have become more prevalent as device geometries shrink into the deep sub-micron range.

A conductive plug filling a via hole is typically formed by depositing a dielectric interlayer on a conductive layer comprising as least one conductive pattern, forming an opening through the dielectric interlayer by conventional photolithographic and etching techniques, and filling the opening with conductive material. Excess conductive material on the surface of the dielectric interlayer is typically removed by chemical-mechanical polishing (CMP) or chemical etching.

In the formation of integrated circuit structures on and in a semiconductor wafer, one or more layers of metallization are employed to form conductive interconnects or wiring harnesses to various contacts on the processed wafer. Aluminum (Al) is conventionally employed in forming such wiring harnesses or patterned metal layers because it is relatively inexpensive, exhibits a relatively low resistivity and is relatively easy to etch. However, as the size of openings for vias/contacts and trenches is scaled down to the deep sub-micron range, step coverage problems have arisen involving the use of Al, thereby decreasing the reliability of interconnections formed between different wiring layers. Such poor step coverage results in high current density and enhanced electromigration. Moreover, low dielectric constant polyamide materials, when employed as electric interlayers, create moisture/bias reliability problems when in contact with Al.

One approach to improved interconnection paths in vias comprises the use of W plugs. Accordingly, many current semiconductor devices utilizing high integration technology employ Al for a wiring metal and W plugs for interconnections at different levels.

However, the use of W is attendant with several disadvantages. For example, blanket deposition of a W layer on a semiconductor wafer is rather slow at a temperature of about 350° C. Higher temperatures, e.g., about 500° C. to about 550° C., can be employed to increase deposition rates. However, such high temperatures render underlying portions of integrated circuit structures vulnerable to damage. Another disadvantage attendant upon depositing W is that the surface of the layer is not sufficiently uniform or smooth, resulting in a reflectivity of about 20% or less than that of a silicon substrate, thereby rendering it extremely difficult to conduct subsequent patterning of the deposited W layer by conventional photolithographic techniques. Another problem attendant upon depositing a layer of W is that the uniformity of the deposited layer may vary in an amount greater than 1% in thickness across the wafer, as measured by its resistivity.

In U.S. Pat. No. 5,028,565 issued to Chang et al., methodology is disclosed comprising introducing nitrogen ($N_2$) during W CVD for improved surface reflectivity of the deposited W. $N_2$ is also introduced during initial deposition of a nucleation layer, which nucleation layer is said to improve uniformity.

As the requirements for high density escalate, high uniformity, e.g., uniform thickness and as determined by resistivity measurement, of deposited W films becomes more significant and difficult to achieve both within a wafer and from wafer to wafer. Accordingly, there exists a need for methodology for depositing a W layer having improved uniformity. There also exists a need for methodology enabling the deposition of a W layer on a plurality of semiconductor wafers with high wafer-to-wafer uniformity.

DISCLOSURE OF THE INVENTION

An object of the present invention is a method of depositing a uniform layer of W.

Another object of the present invention is a method of manufacturing high density, multi-metal layer semiconductor devices on a plurality of chips by depositing a W layer by CVD, with high uniformity of the deposited W layer within a wafer and from wafer-to-wafer.

Additional objects, advantages and other features of the present invention will be set forth in part in the description which follows and in part will become apparent to those having ordinary skill in the art upon examination of the following or may be learned from the practice of the present invention. The objects and advantages of the present invention can be realized and obtained as particularly pointed out in the appended claims.

According to the present invention, the foregoing and other objects are achieved in part by a method of depositing W by CVD on a substrate in a deposition chamber, the method comprising: flowing $N_2$ in the deposition chamber during a portion of deposition; and omitting $N_2$ during a portion of the deposition.

Another object of the present invention is a method of depositing W by CVD, the method comprising: depositing a W nucleation layer during a nucleation phase by CVD employing gaseous tungsten hexafluoride ($WF_6$); omitting $WF_6$ during an interdeposition phase, wherein substantially no W deposition occurs; depositing a W main deposition layer on the nucleation layer by CVD employing gaseous $WF_6$ during a main deposition phase; flowing $N_2$ during at least the terminal portion of the main deposition phase; and omitting $N_2$ during at least a portion of the nucleation phase and/or interdeposition phase.

Additional objects and advantages of the present invention will become readily apparent to those skilled in this art from the following detailed description, wherein only the preferred embodiment of the present invention is shown and described, simply by way of illustration of the best mode contemplated of carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
FIG. 1 illustrates the impact of $N_2$ on film growth during W CVD.
Figure 1:

The present invention addresses and solves the uniformity problems arising when depositing W by CVD within a wafer and wafer-to-wafer in a cost effective, efficient manner. This objective is achieved in the embodiments of the present invention without any sacrifice in surface reflectivity employing $N_2$ gas during deposition.

The methodology disclosed by Chang et al. in U.S. Pat. No. 5,028,565 constitutes an improvement in uniformity control and repeatability, e.g., thickness and surface reflectivity of a W layer deposited by CVD. However, as integration of semiconductor devices increases rapidly into the deep sub-micron range, the requirements for within wafer and wafer-to-wafer thickness and resistivity uniformity of deposited W films become more significant and, hence, critical. The present invention, therefore, retains the use of $N_2$ during W CVD while improving within wafer and wafer-to-wafer uniformity of W films, e.g., thickness and resistivity, by strategically omitting the flow of $N_2$ during one or more deposition phases.

The role of $N_2$ during W CVD has heretofore been considered to impart a positive impact on the surface reflectivity of the film. Apart from its contribution to reflectivity, $N_2$ has been considered an inert gas and has been employed as a carrier gas for silane ($SiH_4$). However, after extensive experimentation and investigation, it was found that $N_2$ influences film growth kinetics after nucleation.

Conventional practices involve the deposition of a W layer by CVD employing $WF_6$, $SiH_4$ and hydrogen ($H_2$) as gaseous reactants, typically with an inert gas such as argon (Ar). A nucleation layer is initially deposited, primarily by gas phase reduction of $WF_6$ by $SiH_4$ and $H_2$. After deposition of the nucleation layer, the flow of $WF_6$ and $SiH_4$ is discontinued, during which substantially no W deposition occurs. A main deposition phase is then conducted during which a main deposition layer of W is deposited on the W nucleation layer by gas phase reduction of $WF_6$ by $H_2$. The deposition of a nucleation layer is particularly advantageous, as pointed out by Chang et al. in U.S. Pat. No. 5,028,565, when depositing a layer of W on an adhesion layer, such as titanium nitride (TiN). Typical adhesion layers include titanium/titanium nitride (Ti/TiN). The deposition of a nucleation layer employing $SiH_4$ is also advantageous in that there is less penetration of the underlying layer by $H_2$ generated fluoride by-products due to the rapid reaction of $SiH_4$ with $WF_6$, thereby avoiding an increase in resistance and a volcano effect.

With the advent of the methodology disclosed by Chang et al. in U.S. Pat. No. 5,028,565, $N_2$ is flowed during the entire process, including the initial nucleation phase, interdeposition phase and main deposition phase. However, upon extensive experimentation and investigation, it was found that W layers deposited by CVD during which $N_2$ is employed for improved surface reflectivity exhibit an undesirably high degree of nonuniformity, e.g., thickness as determined by resistivity measurement, within a wafer and from wafer-to-wafer. The experimentation and investigation led to the conclusion that $N_2$, in some way, adversely impacts W growth kinetics such that a non-uniform incubation period occurred, after commencing the main deposition phase, during which substantially no actual W deposition occurred. This incubation period was not constant within a wafer and from wafer-to-wafer. Accordingly, the nonuniformity of the W CVD layers within a wafer and from wafer-to-wafer increased. The present invention, however, enables the deposition of W so that any incubation period which may occur after initiating the main deposition phase is substantially constant, thereby enabling regulation of process parameters by routine adjustment to achieve substantial uniformity of a W CVD layer within a wafer, e.g., less than about 2% excluding 6 mm of the wafer perimeter, and substantial cross wafer or wafer-to-wafer uniformity, e.g., as determined by average resistivity measurements.

EXAMPLES

A series of experiments were conducted in an 8-inch commercial reactor with a resistive heater. Ten substrates were employed, each comprising a sputter deposited Ti/TiN (200/800 Å) layer. Initially, a nonreactive gas, such as Ar, was flowed into the deposition chamber. The temperature was held constant in the heater to about 475° C. resulting in an effective wafer temperature of about 435° C. CVD was conducted in three phases: a nucleation phase; an interdeposition phase; and a main deposition phase. During the nucleation phase, $WF_6$ was reduced in the gas phase by $SiH_4$ and $H_2$ at a relatively low pressure of about 4.5 Torr, using a 2:1 $WF_6/SiH_4$ gas flow ratio with 1,000 sccm of $H_2$, to deposit a nucleation layer of about 800 Å. During the interdeposition phase, the flow of $WF_6$ and $SiH_4$ was discontinued, the pressure elevated to about 90 Torr, and substantially no W deposition occurred. During the main deposition phase, a main deposition layer of W was deposited by gas phase reduction of $WF_6$ by $H_2$ at about 90 Torr at varying thicknesses from 0 to about 7,000 Å. The thickness was determined by measuring the sheet resistance (RS) and then calculated by applying an effective film resistivity of 10.3 $\mu$Ohm.cm. The RS was obtained with an automated four-contact probe sampling over 49 points per wafer.

Ten different experimental runs were conducted to demonstrate the impact of $N_2$ during W growth. The only parameter varied during the of experiments was flowing $N_2$ at different times during W deposition. Each experiment was carried out on a lot of twenty-five wafers. The thickness uniformity within each wafer and average thickness from wafer-to-wafer of each lot was determined by resistivity measurements. The results of the experiments and $N_2$ presence are shown in FIG. 1.

Adverting to FIG. 1, Experiments 1–4 illustrate the destabilizing effect of $N_2$ at the end of the nucleation phase. When $N_2$ is absent at the end of the nucleation phase, the entire W stack growth is stable. On the other hand, film growth is unstable if $N_2$ is present.

With continued reference to FIG. 1, Experiments 6–9 demonstrate that the absence of $N_2$ at the end of the nucleation phase or at the beginning of the interdeposition phase produces stable W growth. It was quite unexpected to discover that the absence of $N_2$ only during the interdeposition phase, where no actual W deposition occurs, provides stable and repeatable film growth. The results demonstrate that the role of $N_2$ is not simply limited to its influence on grain size or surface reflectivity. Rather, as shown in FIG. 1, $N_2$ influences growth of the main deposition layer on the nucleation layer.

Figure 2:
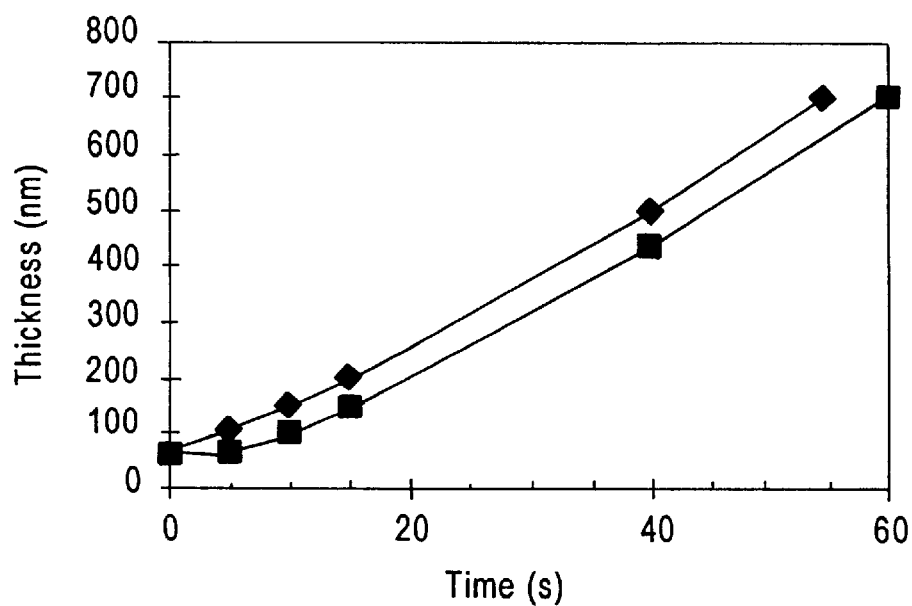
FIG. 2 is a graph showing film thickness as a function of deposition time.

FIG. 2 contains a plot of film thickness versus deposition time in wafers, wherein $N_2$ was employed only during the main deposition phase and wherein $N_2$ was employed during the interdeposition phase and during the main deposition phase. In these experiments, $N_2$ was not employed during the nucleation phase. Adverting to FIG. 2, it is observed that the presence of $N_2$ during the interdeposition phase delayed initiation of the main deposition phase. This incubation period extended for about 5 seconds after $WF_6$ was introduced into the reactor at 90 Torr to initiate the main deposition phase. After about 5 seconds, both growth rates appeared substantially the same. Accordingly, it would appear that an unstable inhibition mechanism is induced by $N_2$ at the end of the nucleation phase.

The present invention, therefore, stems from the discovery that $N_2$, although beneficial insofar as improving surface reflectivity of a CVD W layer, affects film growth kinetics after nucleation, resulting in increased thickness nonuniformity of W layers within a wafer and from wafer-to-wafer. The present invention solves such a nonuniformity problem by strategically omitting the flow of $N_2$ during deposition.

Embodiments of the present invention include depositing a layer of W by CVD in a CVD chamber, as on an adhesion layer, such as Ti/TiN. A nucleation layer is initially deposited during an initial nucleation phase and, after an intervening interdeposition phase, a main deposition layer is deposited during a main deposition phase. During the deposition process, $N_2$ is strategically employed to improve surface reflectivity, and strategically omitted to enhance W layer uniformity within a wafer and thickness uniformity from wafer-to-wafer.

Figure 3:
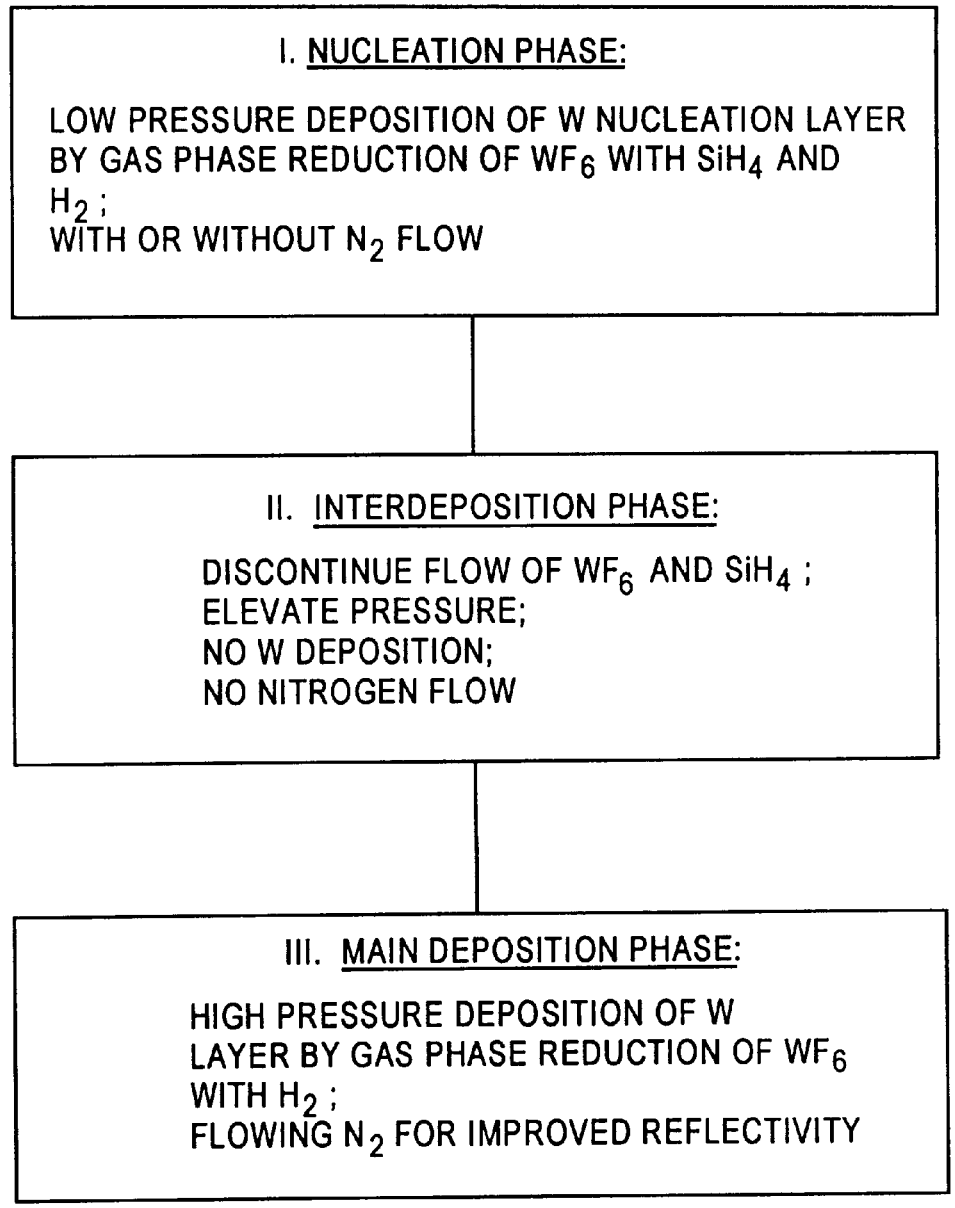
FIG. 3 is a flow chart illustrating an embodiment of the present invention.

An embodiment of the present invention is illustrated in FIG. 3 and comprises depositing a W nucleation layer during the initial nucleation phase employing $WF_6$, $SiH_4$ and $H_2$ gaseous reactants, with or without an inert carrier gas such as Ar, at a first temperature and a first pressure. $N_2$ can be flowed or omitted during the nucleation phase. After the nucleation layer has been deposited, the flow of $WF_6$ and $SiH_4$ is discontinued and the pressure elevated during the interdeposition phase. $N_2$ is omitted during the interdeposition phase. The main deposition phase is then conducted employing $WF_6$ and $H_2$ gaseous reactants with or without an inert gas. $N_2$ is flowed during at least the latter portion of the main deposition phase, e.g., the entire main deposition phase, for improved surface reflectivity. Embodiments of the present invention include omitting $N_2$ during at least a portion of the nucleation phase and/or interdeposition phase, e.g., omitting $N_2$ during the entire interdeposition phase, omitting $N_2$ during at least the terminal portion of the nucleation phase, and omitting $N_2$ during the entire nucleation phase.

Given the guidance of the present disclosure, the optimum deposition parameters can be easily determined by routine experimentation. For example, it was found suitable to conduct the nucleation phase for about 12 seconds to about 100 seconds, e.g., about 10 seconds to about 30 seconds, such as about 20 seconds, at a temperature of about 360° C. to about 475° C., e.g., about 390° C. to about 475° C., at a pressure of about 4.5 to about 90 Torr, e.g., about 4.5 to about 30 Torr, to deposit the nucleation layer at a thickness of about 400 Å to about 1,000 Å, e.g., about 400 Å to about 500 Å. It was also found suitable to conduct the main deposition phase for about 8 seconds to about 15 seconds at substantially the same temperature employed during deposition of the nucleation phase, but at a higher pressure of about 70 Torr to about 90 Torr, to deposit the main deposition layer at a thickness of about 3,500 Å to about 10,000 Å, e.g., about 4,000 Å to about 5,000 Å.

During the nucleation phase, a gas mixture can be employed comprising: about 3 to about 60 sccm $WF_6$; about 500 to about 2000 sccm Ar; about 3 to about 60 sccm $SiH_4$; and about 500 to about 2000 sccm $H_2$. During the main deposition phase, a gas mixture can be employed comprising: about 15 to about 300 sccm $WF_6$; about 500 to about 5000 scam Ar; about 500 to about 5000 scam $H_2$; and about 0 to about 1000 scam $N_2$.

The present invention enjoys applicability in various technological areas, particularly in the manufacture of semiconductor devices wherein W layers are conventionally deposited, as in filling via holes to form conductive vias interconnecting upper and lower conductive lines, and in forming tungsten silicide low resistivity contacts on polycrystalline silicon layers and source/drain regions, as by thermally treating the deposited W layers. In filling a via opening in a dielectric layer, an initial adhesion promoting layer, such as Ti/TiN, is deposited to line the opening. The inventive methodology is then conducted, as by depositing a W nucleation layer, discontinuing the flow of $WF_6$ during the interdeposition phase and then conducting the main deposition phase. $N_2$ is strategically employed, as during the main deposition phase, for improved surface reflectivity of the CVD W layer. However, $N_2$ is strategically omitted, as during at least a portion of the nucleation phase and/or interdeposition phase, to improve the thickness uniformity of W films within a wafer and thickness uniformity from wafer-to-wafer. Thus, embodiments of the present invention comprise omitting the flow of $N_2$ during at least a portion of the nucleation and/or interdeposition phases, e.g., omitting $N_2$ during the entire interdeposition phase, to obtain stable thick growth. $N_2$ can also be omitted during the entire nucleation phase. Therefore, embodiments of the present invention include the use of about 0 to about 1000 scam of $N_2$ during the nucleation phase.

The strategic omission of $N_2$ during the deposition method in accordance with the present invention results in a uniform incubation period during the main deposition phase, thereby enabling control of the uniformity of the W films within a wafer and form wafer-to-wafer. Embodiments of the present invention unexpectedly achieve high uniformity by omitting $N_2$ during the interdeposition phase during which substantially no W growth occurs.

The present invention is applicable to depositing W layers in various industrial applications, such as manufacturing magnetic recording media and semiconductor devices. The present invention has particular applicability in manufacturing high density multi-metal layer semiconductor devices having deep sub-micron features. The present invention advantageously achieves thickness uniformity of W CVD film layers within a wafer and from wafer-to-wafer, thereby increasing production throughput and reducing manufacturing costs. The present invention can be easily implemented in existing production lines without any substantial modification of equipment or installation of new equipment.

In the previous descriptions, numerous specific details are set forth, such as specific materials, structures, chemicals, processes, etc., in order to provide an understanding of the present invention. However, the present invention can be practiced without resorting to the details specifically set forth. In other instances, well known processing structures have not been described in detail in order not to unnecessarily obscure the present invention.

Only the preferred embodiment of the present invention and an example of its versatility are shown and described in the present disclosure. It is to be understood that the present invention is capable of use in various other combinations and enviroments and is capable of changes or modifications within the scope of the inventive concept as express herein.

We claim:

1. A method of depositing tungsten by chemical vapor deposition on a substrate in a deposition chamber, the method comprising:

flowing nitrogen into the deposition chamber during a portion of deposition;

depositing a tungsten nucleation layer during a nucleation phase;

conducting an interdeposition phase;

depositing a tungsten main deposition layer during a main deposition phase; and omitting nitrogen during at least a portion of the nucleation phase and/or interdeposition phase.

2. The method according to claim 1, wherein:

flowing nitrogen during deposition improves the surface reflectivity of the deposited tungsten; and omitting nitrogen during a portion of the deposition improves the uniformity of the deposited tungsten.

3. The method according to claim 1, comprising:

depositing the tungsten nucleation layer employing tungsten hexafluoride, hydrogen and silane gaseous reactants, with or without an inert carrier gas, at a first temperature and first pressure;

discontinuing the flow of tungsten hexafluoride and silane during the interdeposition stage, during which substantially no tungsten is deposited; and depositing the tungsten main deposition layer employing tungsten hexafluoride and hydrogen gaseous reactants, with or without an inert carrier gas, at a second temperature and second pressure.

4. The method according to claim 3, comprising:

flowing nitrogen gas during the main deposition phase; and omitting nitrogen during the interdeposition phase.

5. The method according to claim 4, comprising omitting nitrogen during at least the terminal portion of the nucleation phase.

6. The method according to claim 4, comprising omitting nitrogen during the entire interdeposition phase and/or the entire nucleation phase.

7. The method according to claim 3, comprising:

flowing nitrogen during the main deposition phase; and omitting nitrogen during at least the terminal portion of the nucleation phase.

8. The method according to claim 7, comprising omitting nitrogen during the entire nucleation phase.

9. The method according to claim 4, comprising omitting nitrogen during the initial portion of the main deposition phase.

10. The method according to claim 3, wherein:

the first and second temperatures are substantially the same; and the second pressure is greater than the first pressure; the method further comprising elevating the first pressure to the second pressure during the interdeposition phase.

11. The method according to claim 3, comprising:

depositing a layer containing titanium nitride in an opening of a dielectric layer;

depositing the tungsten nucleation layer on the titanium nitride layer; and depositing the tungsten main deposition layer filling the opening and forming a conductive via in a semiconductor device.

12. The method according to claim 11, comprising:

depositing the tungsten nucleation layer at a pressure of about 4.5 to about 90 Torr at a temperature of about 360° C. to about 475° C. for about 12 seconds to about 100 seconds at a thickness of about 400 Å to about 4,000 Å; and depositing the tungsten main deposition layer at a temperature of about 360° C. to about 475° C., at a pressure of about 70 Torr to about 90 Torr, for about 8 seconds to about 15 seconds to form a main deposition layer having a thickness of about 3,500 Å to about 10,000 Å.

13. The method according to claim 12, wherein the first and second temperature is about 390° C. to about 475° C. the pressure during the nucleation phase is about 4.5 to about 30 Torr, the thickness of the tungsten nucleation layer is about 400 Å to about 500 Å, and the thickness of the tungsten main deposition layer is about 4,000 Å to about 5,000 Å.

14. The method according to claim 12, comprising:

flowing a gas mixture during the nucleation phase comprising:
about 3 to about 60 sccm tungsten hexafluoride;
about 500 to about 2000 sccm argon;
about 3 to about 60 sccm silane; and
about 500 to about 2000 scam hydrogen; and flowing a gas mixture during the main deposition phase comprising:
about 15 to about 300 scam tungsten hexafluoride;
about 500 to about 5000 scam argon;
about 500 to about 5000 scam hydrogen; and
about 0 to about 1000 scam nitrogen.

15. The method according to claim 11, comprising:

filling a plurality of openings in dielectric layers on a plurality of semiconductor wafers to form a plurality of conductive vias; wherein omitting nitrogen increases the uniformity of the deposited tungsten within each wafer and from wafer to wafer.

16. The method according to claim 15, wherein the incubation time before tungsten deposition after initiating the main deposition phase is substantially constant within a wafer and from wafer to wafer.

17. A method of manufacturing a semiconductor device, the method comprising:

depositing a layer comprising titanium nitride on a substrate of a semiconductor wafer;

depositing a tungsten nucleation layer by chemical vapor deposition employing gaseous tungsten hexafluoride on the titanium nitride layer during a nucleation phase;

omitting tungsten hexafluoride during an interdeposition phase wherein substantially no tungsten deposition occurs;

depositing a main tungsten layer on the nucleation layer by chemical vapor deposition employing gaseous tungsten hexafluoride during a main deposition phase;

flowing nitrogen during at least the terminal portion of the main deposition phase; and omitting nitrogen during at least a portion of the nucleation phase and/or interdeposition phase.

18. The method according to claim 17, comprising omitting nitrogen during the entire interdeposition phase.

* * * * *